(12) United States Patent
Bosboom

(10) Patent No.: US 12,397,951 B2
(45) Date of Patent: Aug. 26, 2025

(54) RETICLE COMPACT BOX OPENER

(71) Applicant: JABIL INC., St. Petersburg, FL (US)

(72) Inventor: Jeroen Bosboom, St. Petersburg, FL (US)

(73) Assignee: JABIL INC.

( * ) Notice: Subject to any disclaimer, the term of this patent is extended or adjusted under 35 U.S.C. 154(b) by 445 days.

(21) Appl. No.: 18/071,097

(22) Filed: Nov. 29, 2022

(65) Prior Publication Data

US 2024/0174396 A1 May 30, 2024

(51) Int. Cl.
| | |
|---|---|
| *B65B 43/26* | (2006.01) |
| *B65B 57/00* | (2006.01) |
| *B65B 57/10* | (2006.01) |
| *G03F 1/66* | (2012.01) |
| *G03F 7/00* | (2006.01) |
| *H01L 21/673* | (2006.01) |

(52) U.S. Cl.
CPC .......... *B65B 43/265* (2013.01); *B65B 57/005* (2013.01); *B65B 57/10* (2013.01); *G03F 1/66* (2013.01); *G03F 7/70741* (2013.01); *H01L 21/67359* (2013.01)

(58) Field of Classification Search
CPC ............ G03F 7/70741; G03F 7/70733; G03F 7/7075; G03F 7/70983; G03F 1/66; B65B 57/10; B65B 57/005; B65B 43/265; H01L 21/67379; H01L 21/67353; H01L 21/67772; H01L 21/67359; H01L 21/67373; H01L 21/67775; H01L 21/67778; H01L 21/68707; H01L 21/6779; H01L 21/68714; H01L 21/68721; H01L 21/68728; H01L 21/68735; H01L 21/68778; B03B 23/02
See application file for complete search history.

(56) References Cited

U.S. PATENT DOCUMENTS

| | | | | |
|---|---|---|---|---|
| 4,999,671 | A * | 3/1991 | Iizuka | G03F 7/70741 355/75 |
| 6,364,595 | B1 * | 4/2002 | Bonora | H01L 21/68707 414/416.1 |
| 2019/0333797 | A1 * | 10/2019 | Chen | G03F 1/66 |

* cited by examiner

*Primary Examiner* — Glenn F Myers
(74) *Attorney, Agent, or Firm* — Riverside Law LLP

(57) ABSTRACT

An apparatus, system and method for a compact box opener suitable for opening a compact box containing therein a reticle. The embodiments provide: a flowthrough deck; a plurality of location guides on the flowthrough deck suitable to mate with guides on a base of the compact box; a plurality of vacuum ports on the plurality of location guides capable of retaining the guides on the base; a lid opening arm having a suction cup at an end thereof, wherein the suction cup is capable of gripping a lid of the compact box and opening the lid by an actuation of the lid opening arm; rotary-actuated arms that are raised for initial actuation within the drawer above a rim of the compact box and which, when actuated, rotate jaws at an end of each of the rotary-actuated arms inward over the rim and downward to a height below a lower plane of the reticle; and at least one angular notch in each of the jaws suitable to grip a radiused edge of the reticle. Once the radiused edge of the reticle is gripped by the inward movement of the jaws, the jaws are raised while the reticle remains gripped until the reticle is at a second height fully above the rim.

20 Claims, 15 Drawing Sheets

RETICLE COMPACT BOX OPENER

FIELD OF THE INVENTION

The disclosure relates generally to lithographic processes, and, more particularly, to an apparatus, system, and method of providing a reticle compact box opener.

BACKGROUND

A reticle (also referred to as a reticule, or a graticule) is a pattern built into, for example, a photolithographic lens, to provide reference markings. Semiconductor lithography requires handling of such reticles, which are typically formed of glass, for the purpose of creating the nanometer scale patterns upon which semiconductor chip patterns are based.

The safe storage and handling of a reticle often involves a "compact box" (CB) shipping container, in which resides one reticle. While the CB is generally safe to handle manually in a clean room when using cleanroom etiquette and methods, opening the CB to remove or replace the reticle is best handled inside a robotic work cell, preferably with a separately controlled cleanroom environment, inside the cleanroom itself. Automated handling of the reticle keeps contamination of the reticle at an absolute minimum—a necessity for efficient semiconductor fabrication. However, the design of the industry standard CB shipping and storage container was not made in contemplation of automation as a primary consideration in reticle handling, and consequently very few features suitable to enable automation are present in relation to the CB or the reticle.

Notwithstanding the lack of automation enabling features, using the CB for both storage of the reticle and to simplify reticle processing is efficient and economical, at least because such use of the CB avoids having additional, separate, and unnecessary transfer of the reticle into and within the work cell environment. Therefore, the need exists for an automated or a semi-automated CB opener and a reticle grip-enabling system.

SUMMARY OF THE DISCLOSURE

The embodiments provide an apparatus, system and method for a compact box opener suitable for association with a drawer in a work cell and capable of opening a compact box containing therein a reticle. The embodiments provide: a flowthrough deck; a plurality of location guides on the flowthrough deck suitable to mate with guides on a base of the compact box; a plurality of vacuum ports on the plurality of location guides capable of retaining the guides on the base; a lid opening arm having a suction cup at an end thereof, wherein the suction cup is capable of gripping a lid of the compact box and opening the lid by an actuation of the lid opening arm; rotary-actuated arms that are raised for initial actuation within the drawer above a rim of the compact box and which, when actuated, rotate jaws at an end of each of the rotary-actuated arms inward over the rim and downward to a height below a lower plane of the reticle; and at least one angular notch in each of the jaws suitable to grip a radiused edge of the reticle. Once the radiused edge of the reticle is gripped by the inward movement of the jaws, the jaws are raised while the reticle remains gripped until the reticle is at a second height fully above the rim.

Thus, the embodiments provide an automated or a semi-automated compact box opener and a reticle grip-enabling system.

BRIEF DESCRIPTION OF THE DRAWINGS

This disclosure is illustrated by way of example and not by way of limitation in the accompanying figure(s). The figure(s) may, alone or in combination, illustrate one or more embodiments of the disclosure. Elements illustrated in the figure(s) are not necessarily drawn to scale. Reference labels may be repeated among the figures to indicate corresponding or analogous elements.

DETAILED DESCRIPTION

Figure 1:
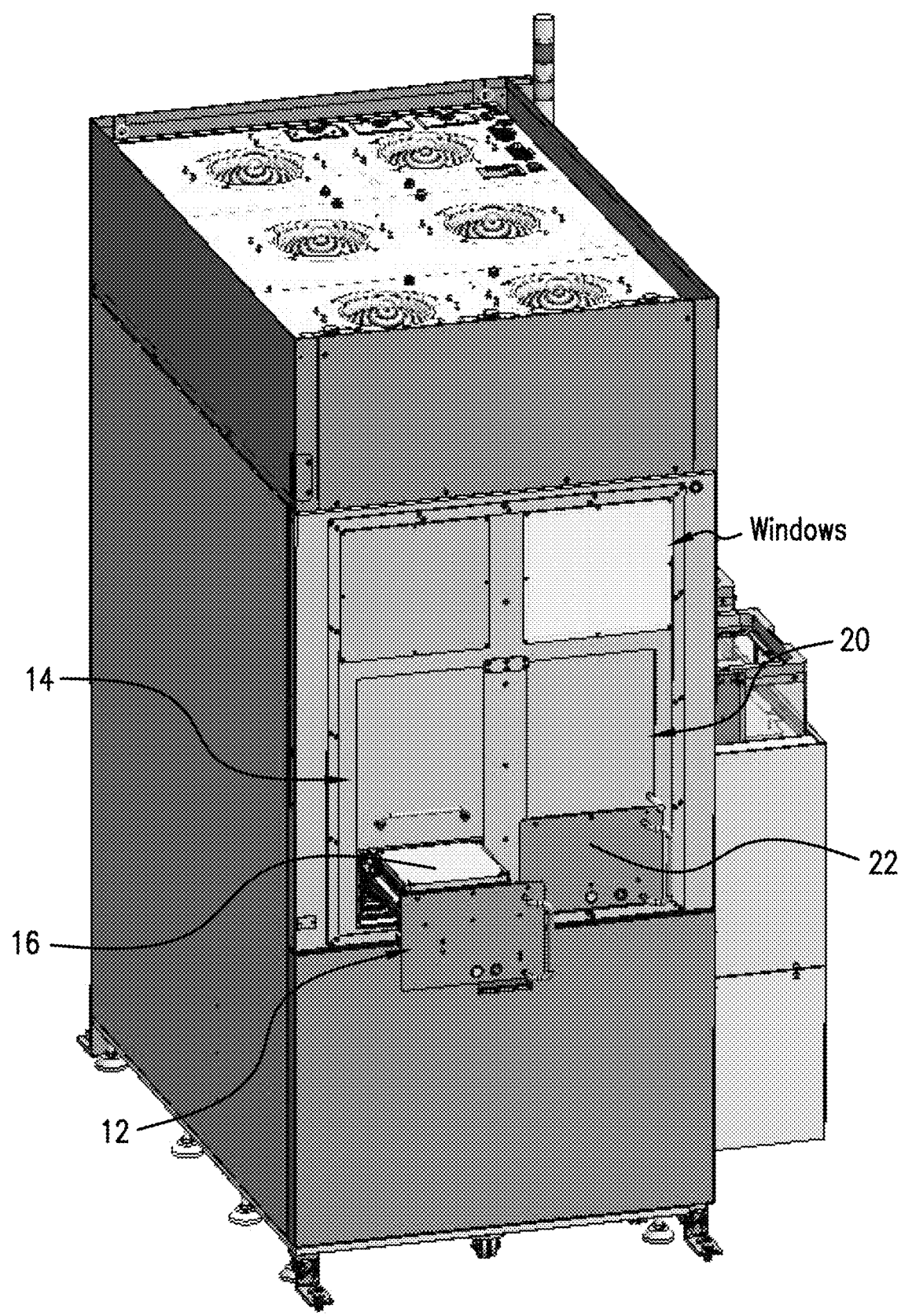
FIG. 1 illustrates aspects of an exemplary embodiment of the present invention.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context. Thus, a first element, component, region, layer or section discussed below could be termed a second element, component, region, layer or section without departing from the teachings of the exemplary embodiments.

As discussed above, a reticle, which is often involved in semiconductor processing, is often transported in a compact box. The outside of the compact box (CB), at the the upper and lower lids thereof, usually features molded corner guides close to the CB's outer corners. These molded guides may be, for example, approximately 2 mm tall, and are provided to enable stacking of the CBs one atop the other. That is, the lower portion corners guides of one CB may nest in the upper lid corner guides of an adjacent CB, such that that the CBs may be readily stacked.

These provided corner guides are well suited for repeatably assessing location of the CB, such as on dedicated support tooling, since the corner guides are uniformly molded with the CB. Positional repeatability is of significant importance in the embodiments, as the proper picking and placing of reticles repeatedly depends on the repeatability of assessing the position of the reticle in the CB as it is removed from the CB, which in turn is dependent upon the repeatability of the CB position.

Inside the CB, the reticle is typically located on kinematic locating posts at the four corners of the CB interior, "sunken" within the lower portion of the CB. That is, these posts support the reticle below the rim level of the lower CB portion. Therefore, in the known art it is difficult to efficiently lift the reticle out of the CB, at least because the tooling must reach over the lower box rim, perpendicularly to the reticle's surface planes, but then must reach parallel to the reticle's surface plane below the reticle's edge, in order to support the reticle from below such that the reticle may be lifted out of the CB.

Further, it is preferred that the reticle gripper support only the edge radii of the reticle when the reticle is lifted and removed from the CB. This edge contact limits the transfer of particles, damage, and/or chemical contributions to portions of the reticle that are to be involved in subsequent processing.

Further, the CB typically includes two forward facing latches which may slide in opposite directions or in a uniform direction to allow manual opening of the CB, such that the CB may be loaded or unloaded with a reticle. In the embodiments, the directional requirements of these latches may be "learned", and thus the CB may be opened automatically, such as with an actuator or fixed cam. Further, to allow for automated opening of the CB, the embodiments provide an arm to grasp and rotate open the top lid of the CB.

Moreover and as referenced above, it is typical that the edge of the reticle, which must be grasped for automated processing, sits below the rim of the lower CB portion. Thus, the embodiments support the reticle and lift the edge of the reticle above the rim of the lower CB portion so that the reticle can be readily grasped by a robotic end effector.

More specifically, the disclosed CB opener and handler may provide a process bridge for introducing reticles into and out of a robotic work cell. The disclosed CB opener may include: an access drawer for the work cell with CB nesting features; detection sensors for the reticle, such as may include go/no go sensors for the pellicle positioning on the underside of the reticle; a CB upper lid opener/closer; and a reticle clamping and lifting arm/jaw assembly, provided to raise and present the reticle from the CB.

In short, first, the CB drawer on the work cell is opened. Thereafter, either manually or automatically, the CB is placed onto four corner-keyed tools. The drawer may then be closed, manually or automatically, to the forward position. Air flow on the drawer plate may be a purposefully vented/vacuum design to reduce back flow of particles into the opened compact box. The drawer may be equipped with open and closed locks to ensure repeatable robot pick positioning.

The CB "nest" may include vacuum cups, such as at the four corner-keys to ensure that the CB features are properly seated, such that proper vacuum pressure is sensed. The latches on the CB front may then be manually or automatically opened, and/or sensors may verify that the latches are released and that the box is therefore ready to open.

Once the CB is seated and its position verified, the lid opener arm may rotate to contact a lid opener vacuum cup to the upper lid of the CB. The vacuum cup holds the lid while the lid opener arm is retracted, thereby opening the upper lid of the CB.

Reticle and pellicle position detection sensors may verify that the reticle is present, such as by assessing that the pellicle is in the proper alignment. The pellicle is used to indicate whether the reticle is improperly rotated by 90 degrees. Avoiding this 90 degree rotation is crucial to the downstream handling of the reticle.

The reticle may then be retrieved by a lift actuator assembly. In this process, a lift plate may be raised so that the support arms, and thus the reticle jaws at the ends thereof, are above the CB lower portion rim. The lift arms are rotated inward to a vertical position, with the transverse slide still extended outwardly. The lift actuator assembly is lowered, dropping the reticle jaws below the CB rim and the reticle. The reticle clamping jaws at the end of the lifting arms may include inclined/notched ends and a predetermined separation, such as 110 degrees, suited to provide substantially or only edge contact to the radiused lower edges of the reticle.

The transverse reticle arm slides are then extended inward. The reticle jaws are now below the sides of the reticle. The reticle lift assembly is then extended upward, causing the rotating arms and slides to lift the reticle jaws and center the reticle (only the edge of the reticle, and not the bottom or side, is contacted).

The reticle is then lifted above the CB rim. During the lift, the reticle is re-centered in the jaws above the CB. During the loading process, this centering guides the reticle to within the kinematic pins (there is slight clearance and the pins are tapered to guide the reticle in).

The reticle is raised enough for a robotic end effector to grasp the edge of the reticle, combing it with edge contact only. The end effector then signals control of the reticle to the cell controller, and the reticle jaws of the CB opener lift assembly are transversely retracted, thus releasing support of the reticle.

The disclosed jaw insertion and lifting motion thus enables the unloading and loading of reticles automatically. Crucially, it reaches over the CBox rim, down and over from each side, in extremely tight quarters, contacting only the radiused edges of the reticle.

Of course, various other reticle security of process mechanisms may be included in the embodiments. By way of example, dual solenoid center locking valves may ensure that the actuator position is held during emergency stop or a power loss. The clamping arms/jaws may also have a spring assist in order to stay closed on power off, instead of dropping a reticle.

FIG. 1 illustrates a compact box opener work cell 10. At the lower left of the work cell is a drawer 12 and a port 14 suitable to have a compact box 16 installed therein. As discussed, the drawer 12 may be manually or automatically opened, and the compact box 16 is set upon locating guides in the drawer base.

Thus, in order to access the compact box 16 shown within the drawer 12, the port/port shutter 14 is lifted upward to allow for clearance of the compact box 16, and the drawer 12 is pulled outward.

In the illustration, an additional shutter door port 20 and drawer 22 are shown at the right side of the work cell. Moreover, it should be noted that the CB drawer 14 in the illustration is in the open position, with the compact box 16 already placed atop the CB location guides referenced throughout.

Figure 2:
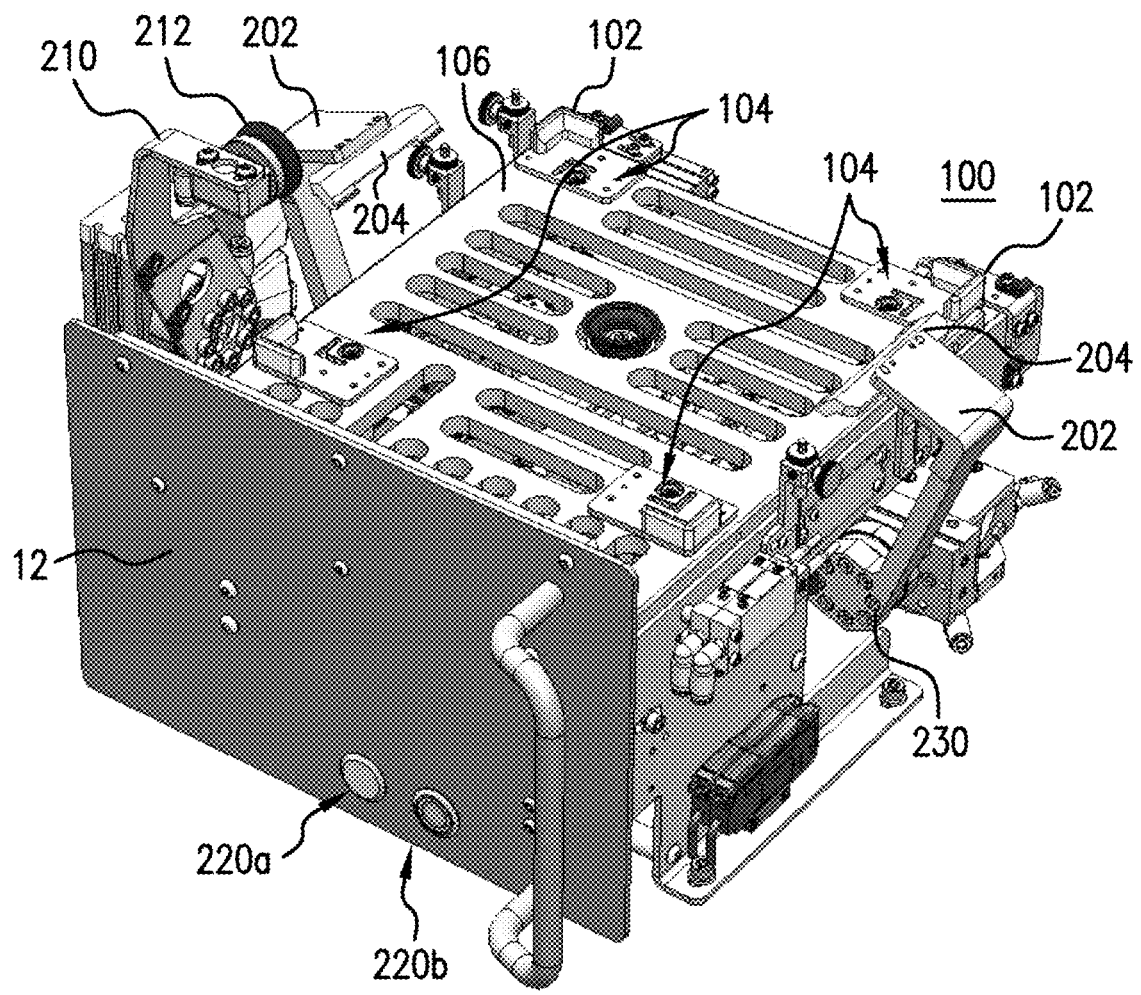
FIG. 2 illustrates aspects of an exemplary embodiment of the present invention.

FIG. 2 illustrates the location guides 102, which may have associated therewith one or more vacuum cups 104 to aid in CB retention, on a flowthrough deck 106 of a compact box opener within drawer 12. In the illustration, the plurality of corner locator guides 102 are physically mounted upon, or may be integral with, the topmost surface of the deck 106. The flowthrough deck 106 may provide, for example, targeted airflow and/or vacuum flow therethrough to decrease particulate or other contaminants from being in the presence of the reticle during opening of the compact box.

FIG. 2 is a more particular illustration of a work cell drawer 12 of FIG. 1, with the disclosed compact box opener 100 resident within the drawer 12, which CB opener is capable of receiving a compact box and guiding it into position for opening, while gripping with the vacuum cups 104. In the illustration, the vacuum cups 104 may be located at the base of the guide locators 102 at a small distance from the angle of the positional guides 102. Although a single vacuum cup per angled locator guide is illustrated, one or more vacuum cups may be provided at each locator guide to positionally maintaining the compact box when it is placed within the guides.

Also illustrated are the reticle support arms 202 and jaws 204 at the ends thereof, which are capable of lifting the reticle once engaged (the arms/jaws are shown in the open/disengaged position). The compact box opener 100 is shown in the disengaged/open position. The illustration further includes a lid arm 210 having at the end thereof a vacuum cup 212 suitable to grip the lid of the compact box for opening.

Also shown in FIG. 2 are a plurality of indicators and sensors 220 which may inform decisions by a manual or automated operator. For example, at the front of the drawer 12 are shown status lights 220a indicating the status of the compact box opener, and an illuminated open switch 220b, which indicates when the drawer 12 is fully open and hence when the compact box opener is actuated and capable of operation.

More particularly, the corner guides 102 and vacuum cups 104 shown may have grooves/angles that are particularly suited to mate with the stacking guides at or near the corners of the base of a typical compact box. These bases at the base of a typical compact box are provided in order to allow stacking of several compact boxes, one atop the other. In the illustration, if the base guides of the compact box fail to properly mate with the corner guides 102 on the deck 106 of the compact box opener, an open circuit may be sensed by sensors 220 and the manual or automated operator is aware that proper retention of the compact box does not exist.

As illustrated in FIG. 2, two gripping arms 202 may be provided on either side of the compact box opener 100, and the gripping arms are each preferably mounted on a rotary actuator 230. This rotary actuator 230 may itself be associated with a linear actuator (not shown), and the entire assembly may rest upon a vertical actuator. Thereby, upward actuation of the vertical actuator may effectuate or support a move into position of the gripping arms, and may also contribute to a rotary closing of the gripping arms 202 upon a reticle, as the arms 202 are also lifted upwards responsive to the vertical actuator. Once the reticle is in position above the uppermost rim of the lower portion of the compact box, it may be grasped by, for example, a robotic end effector for further processing. This is quite distinct from the manual method of operation currently employed with compact boxes, in which a manual operator empties the reticles from the compact boxes by hand into open cassettes, and from those cassettes the reticles are retrieved and gripped for further processing.

Figure 3:
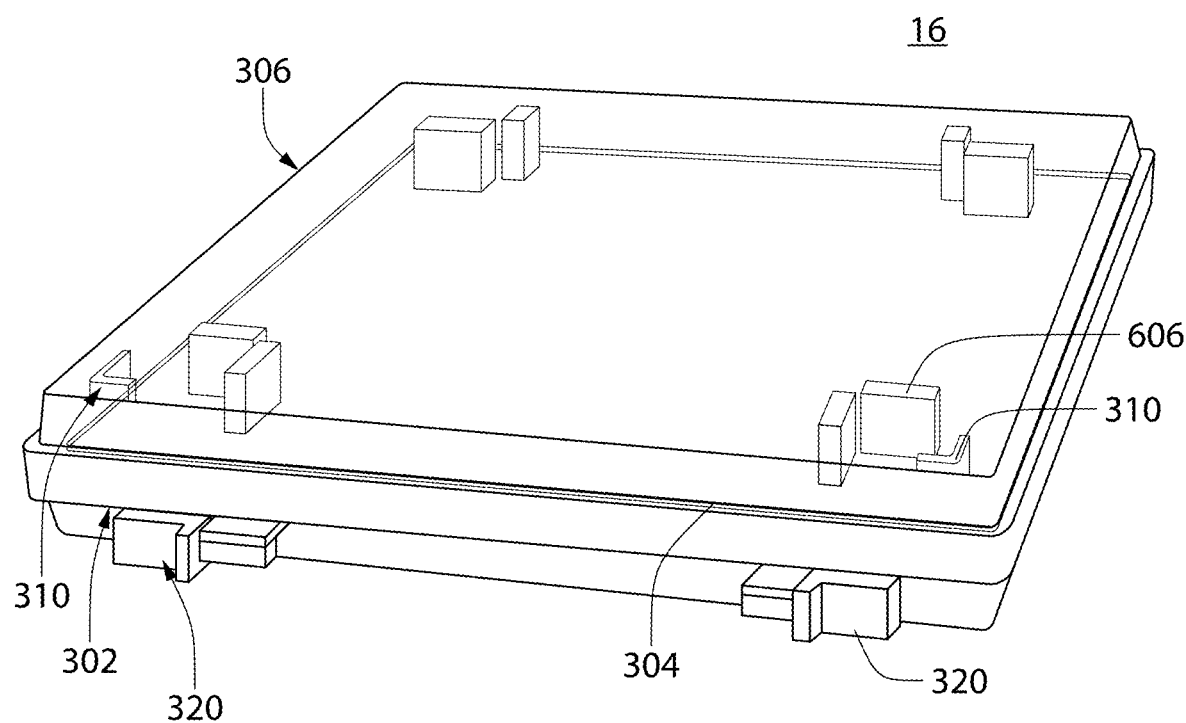
FIG. 3 illustrates aspects of the embodiments.

FIG. 3 illustrates a compact box 16. The compact box 16 includes a lower portion/base 302 which has a rim 304 that mates with an upper portion/lid 306. Within the compact box 16, below the lid and resting on corner guides on the base, is a single reticle (not shown).

Also shown in FIG. 3 atop the lid 306 are the corner stacking guides 310 referenced throughout. This allows for both sensing of position and positional alignment by sensors 220 employed in the processes discussed throughout the disclosure.

Additionally shown in FIG. 3 at the lower portion of the base portion of the compact box are multiple "thumb latches" 320. These thumb latches 320 may be slid to one side in order to unlock the lid portion 306 of the compact box. The thumb latches 320 may slide in a uniform direction, may slide towards each other, or may slide away from each other in order to actuate the lid. In an aspect of the embodiments, cams may be provided to push the thumb latches to automatically open the lid of the compact box, as discussed further below. Alternatively, the thumb latches may be opened by manual operator.

Figure 4A:
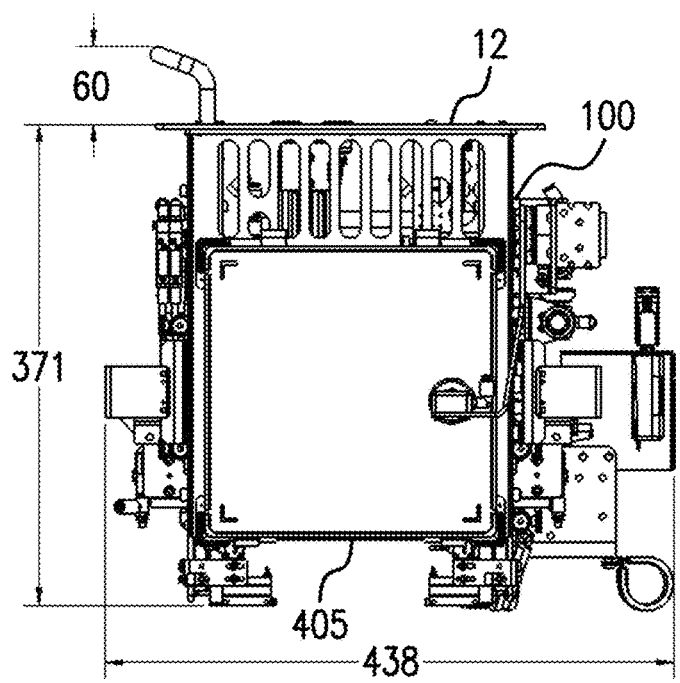
FIGS. 4A, 4B and 4C illustrate aspects of the embodiments.
Figure 4B:
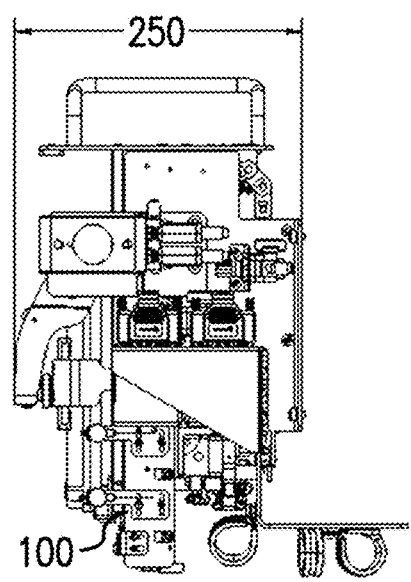
Figure 4C:
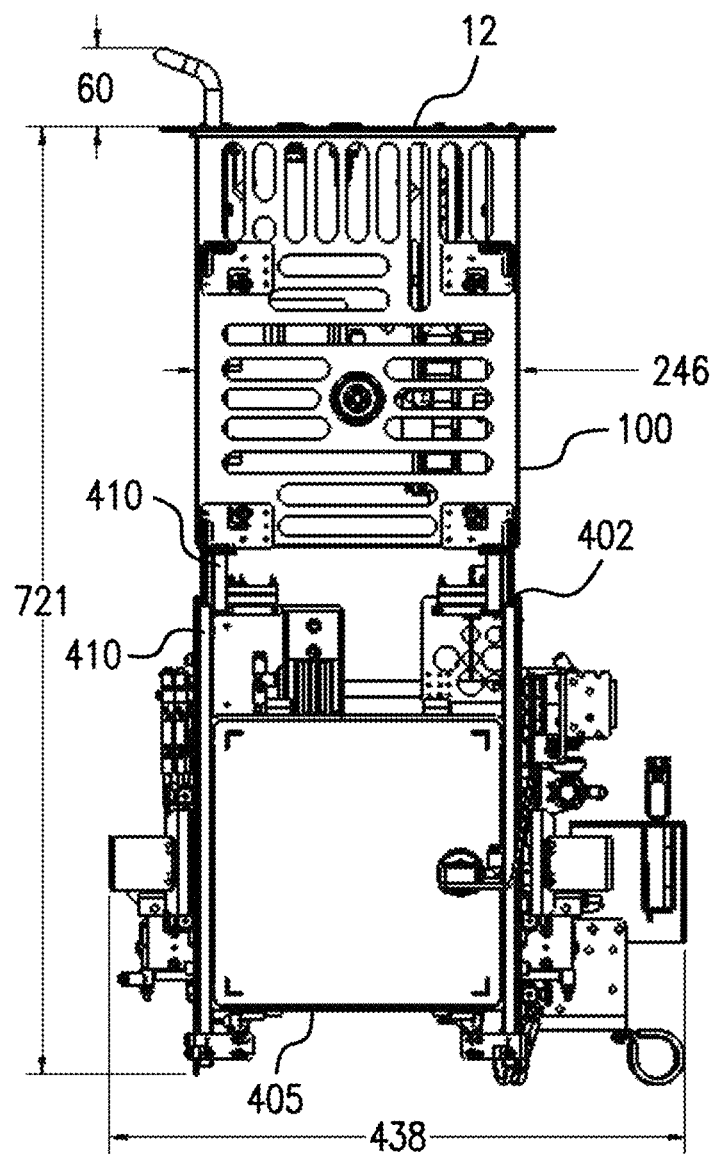

FIGS. 4A, 4B, and 4C illustrate a series of views of the compact box opener 100 resident within the work cell drawer 12, both in the drawer open and drawer closed position. For example, in FIG. 4A, the drawer 12 is shown closed, while in FIG. 4C the release cam 402 for the drawer 12 is actuated and the compact box opener 100 is extended outward from the drawer contours/rear 405 connectively with the extension outward of the drawer front 12. Of note, support rollers/slides 410 may additionally be used, instead of or in conjunction with the extension cam 402 for the opening of the drawer.

Figure 5:
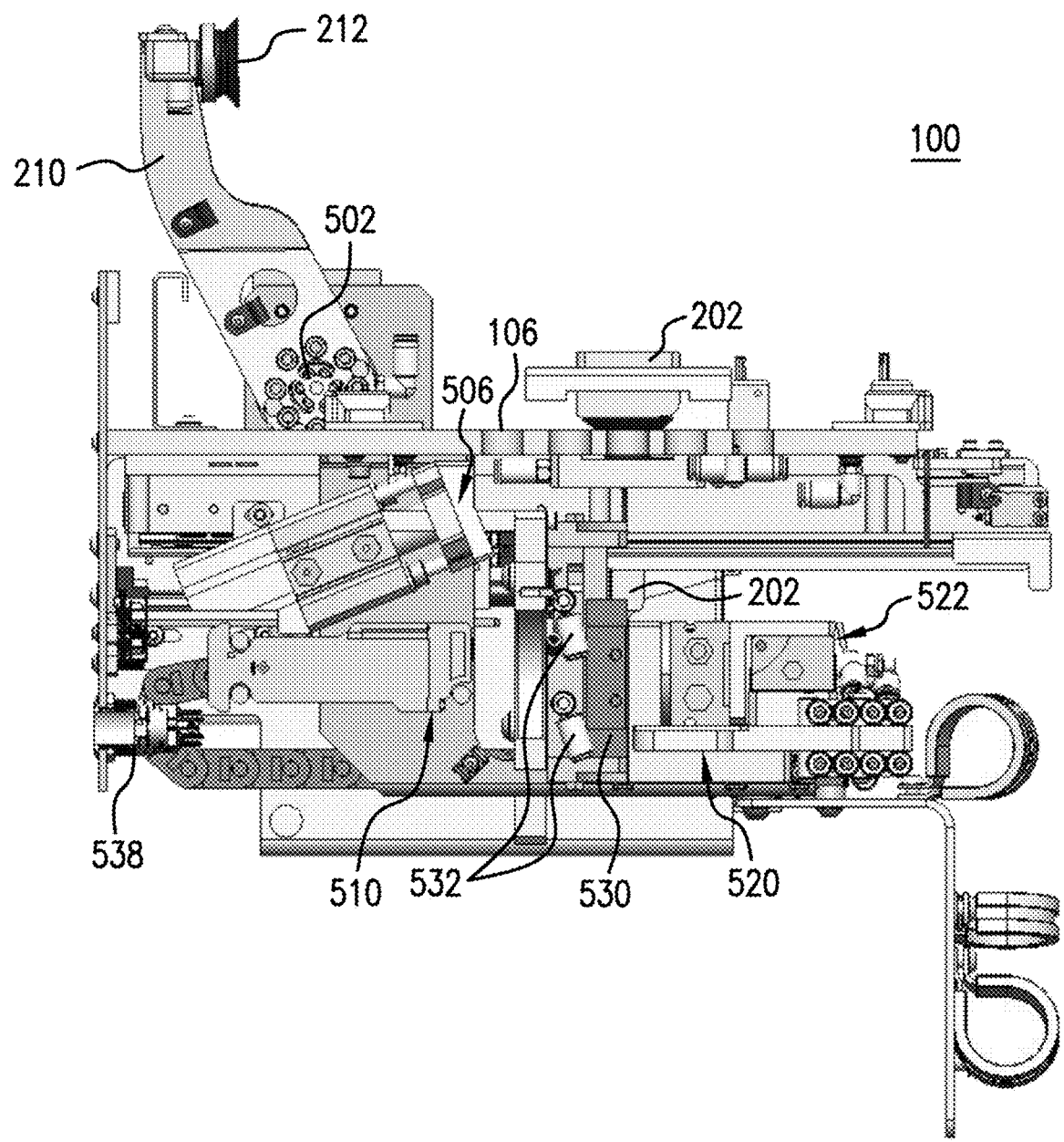
FIG. 5 illustrates aspects of the embodiments.

FIG. 5 illustrates a side cutaway view of the disclosed compact box opener 100. Shown atop the deck 106 is the rotary actuated 502 lid opening arm 210, with a suction cup 212 suitable to grip the lid 306 at the end thereof.

Also shown is a lock cylinder 506 capable of locking the drawer and the other elements disclosed herein, such as the reticle gripping arms 202, in a known position. By way of example, the lock cylinder 506 and a corresponding safety lock system may be actuated, such as by safety interlock switch 510, upon a loss of power or upon a significant gyroscopic change in position of the work cell, for example.

A lift plate 520 may be provided under a transverse slide 522, and associated with the transverse slide and the lift plate may be the rotary actuators on each side which actuate the reticle gripping arms 202. A vertical backplate 530 is associated with one or more vertical actuators 532 and capable of lifting at least the gripping arms 202, and thus the reticle once it is associated with a gripping arms 202, upward to a height at least above the top rim 304 of the lower portion 302 of the compact box 16.

The transverse slide 522 may allow for variability in compact box size. That is, the transverse slide 522 allows for transversal movement to enable a skimming of the gripping jaws 202 over the edge of the compact box in a singular motion. Thus, although the transverse slide 522 could be eliminated in some embodiments, encountering a different size compact box without the transverse slide may thus not enable sufficient clearance for the jaws 204 of the gripping arms 202, which would cause the system to become inoperable to grip and lift the reticle.

Also illustrated in FIG. 5, at the lower left portion of the combat box opener, is a cable management system 538. This cable management system 530 allows for movement of the cabling as needed, as the drawer and actuator of a compact box opener are moved.

Figure 6:
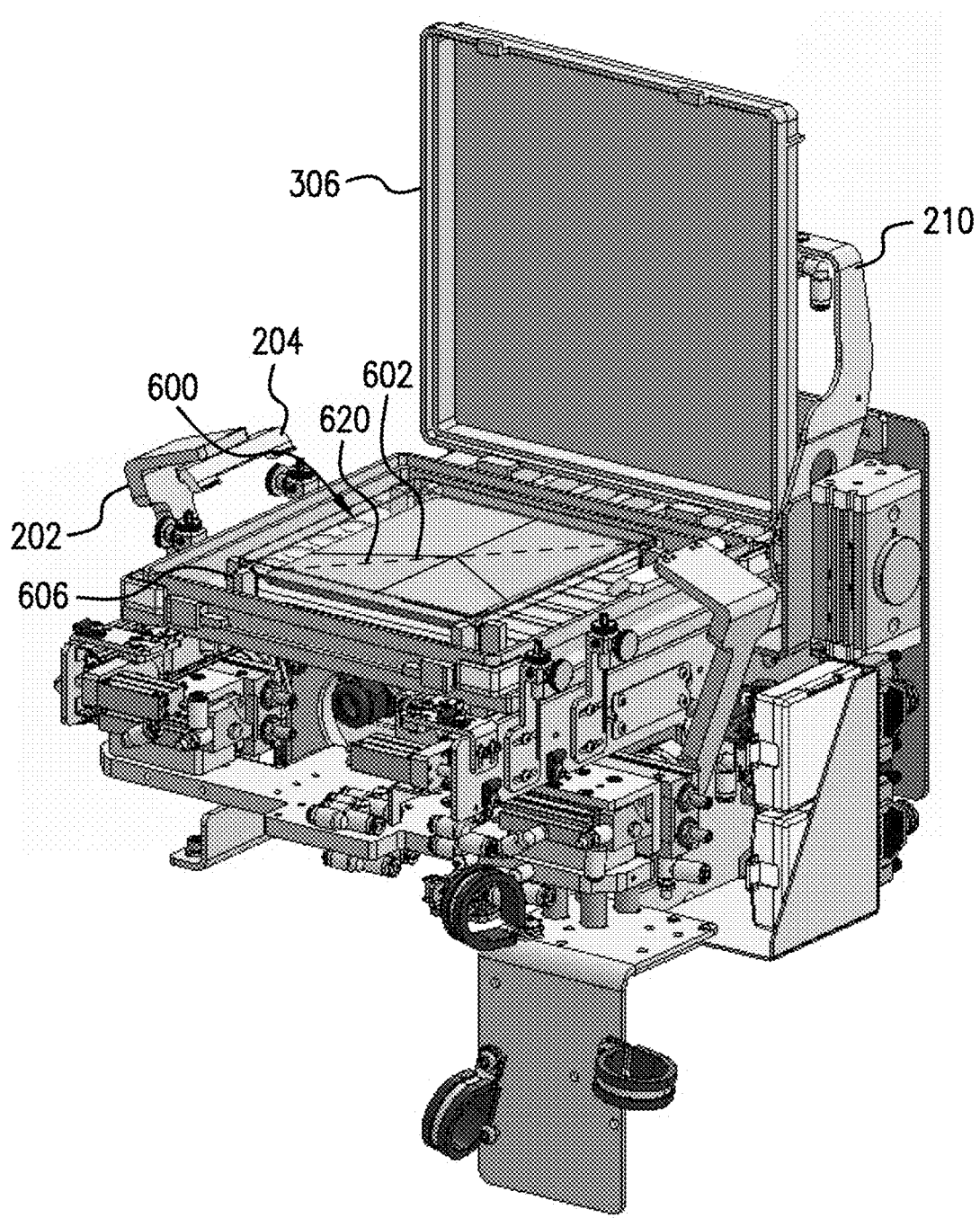
FIG. 6 illustrates aspects of the embodiments.

FIG. 6 illustrates a glass reticle 600, along with a pellicle 602 suitable for assessing alignment of the glass reticle, resting on the kinematic pins 606 of the base 302 of the compact box 16 prior to being lifted. Also shown in FIG. 6 are the gripping and lifting arms 202 of the compact box opener 100 in the open position prior to aligning with the lower edges of the reticle 600. The lid 306 of the compact box is shown as open with the rotary opening arm 210 in the fully upward position and the suction cup thus fully engaged with an upper portion of the lid 306.

In the illustration, cross reticle sensors 620 may be provided to detect the position and lifting of the reticle 600. The sensors 620 may also detect the position of the pellicle 602, which is typically mounted beneath or on the reticle 600. The reticle 600 is typically square in shape, a thus may be 90 degrees off position. While this 90 degrees off position may be catastrophic for the downstream processes in which the reticle 600 is engaged, the only way to assess this off-position occurrence is by process monitoring of the position of the pellicle 602. That is, only the pellicle 602 can provide an alert if the reticle is clocked at 90 degrees off-position.

Figure 7:
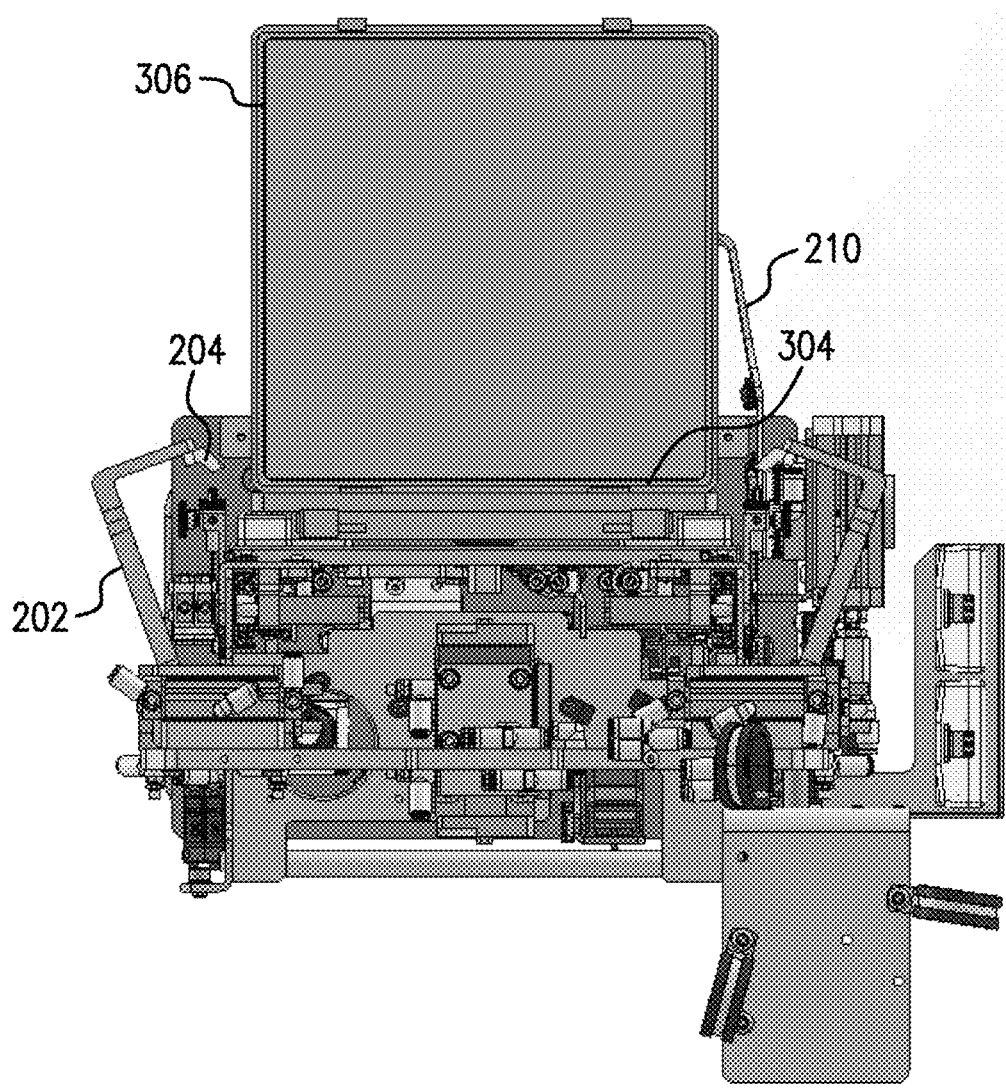
FIG. 7 illustrates aspects of the embodiments.

FIG. 7 illustrates a view of the disclosed compact box opener 100 with the lid open actuator arm 210 having already opened the lid 306. As is also illustrated, the gripping arms 202 and jaws 204 have been raised to a height above the rim 304 of the lower box portion, such that the gripping jaws 204 may now be inserted into the compact box and under the reticle by the rotary actuators.

Figure 8:
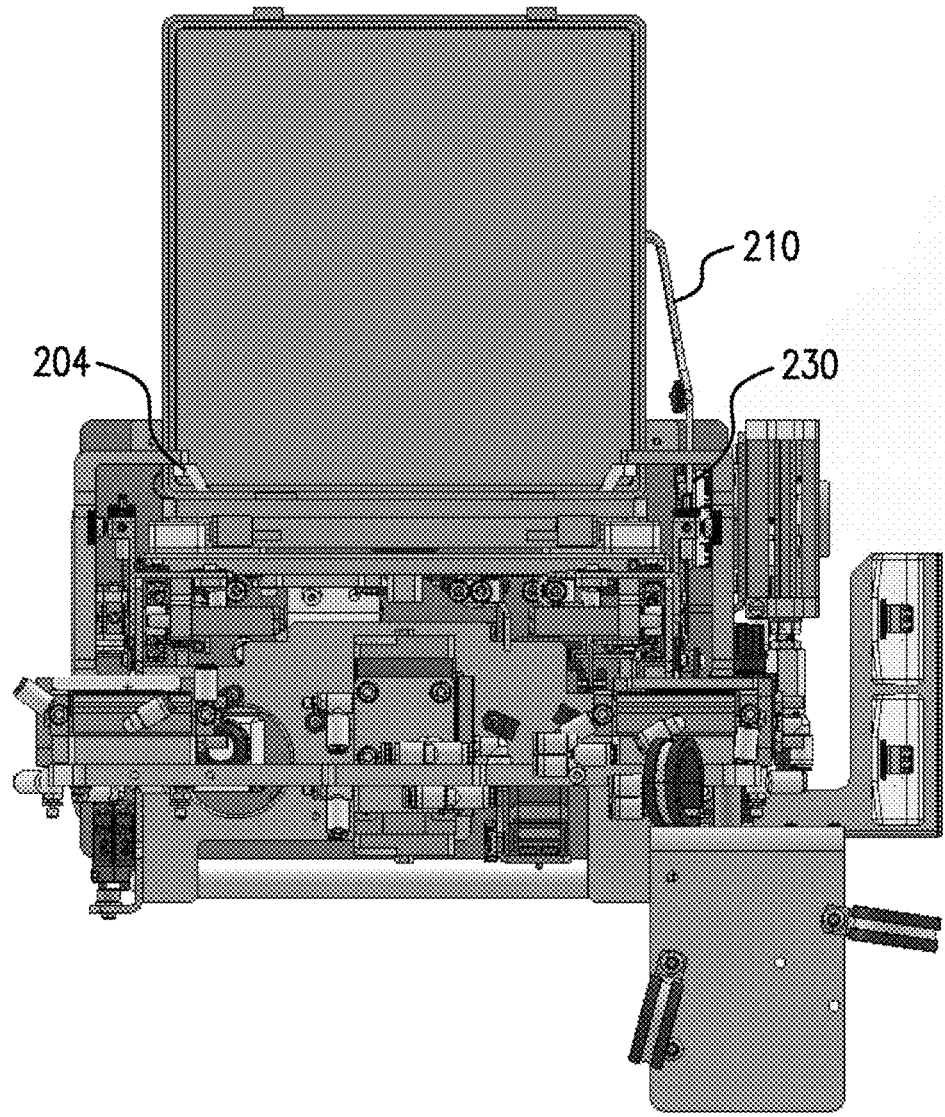
FIG. 8 illustrates aspects of the embodiments.

FIG. 8 illustrates a second step of the embodiment introduced in FIG. 7. In this illustration, the rotary actuators 230 of the gripping arms 210 have rotated the arms 210 inward towards the compact box base, which has inserted the gripping jaws 204 over the rim of the lower compact box portion, and thus into the compact box.

Figure 9:
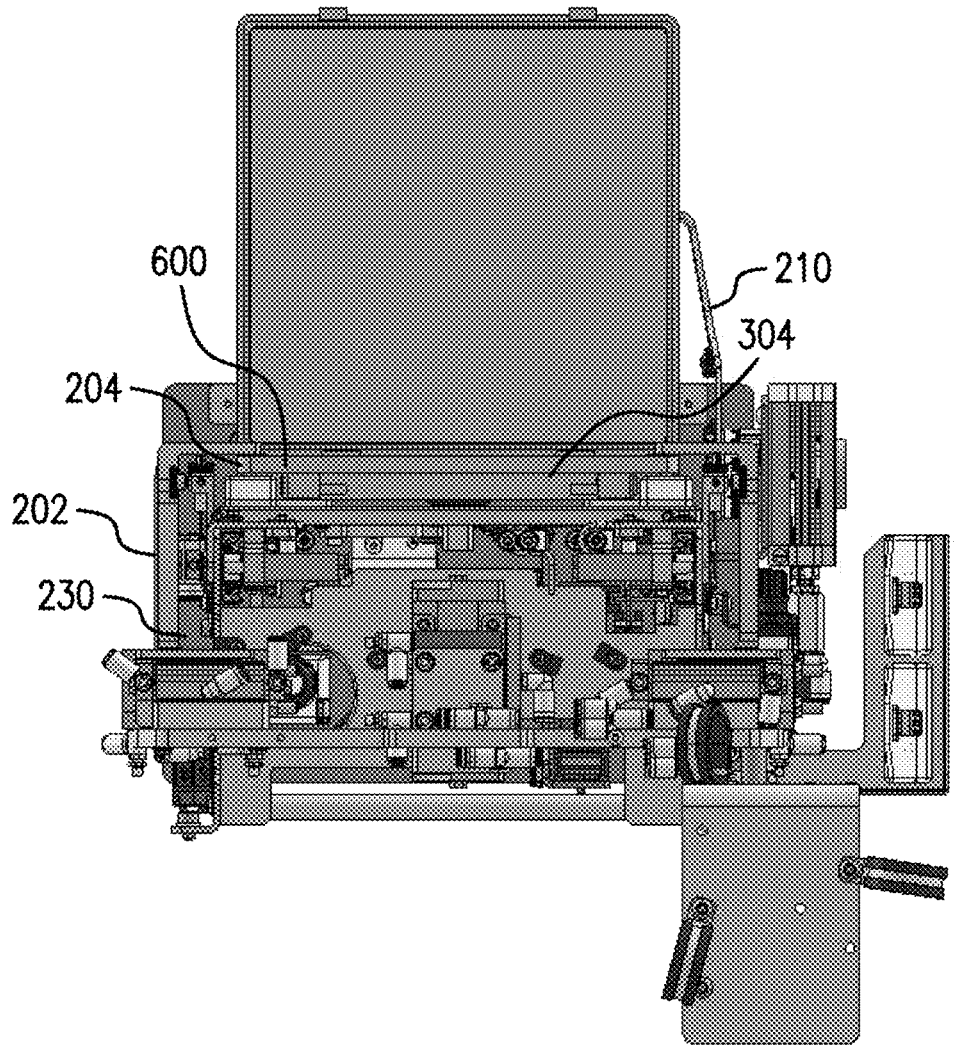
FIG. 9 illustrates aspects of the embodiments.

FIG. 9 illustrates the lowering, by the vertical actuator (see FIG. 5), of the gripping arms 202, which effectuates a lowering of the gripping jaws 204 at the end of the gripping arms 202 to a height beneath the rim 304 of the compact box. Further, the rotary actuation 230 of the gripping arms 202 towards the center of the box provides that the gripping jaws 204 are now located below the reticle 600, such as upon actuation of the vertical actuator (see FIG. 5).

Figure 10A:
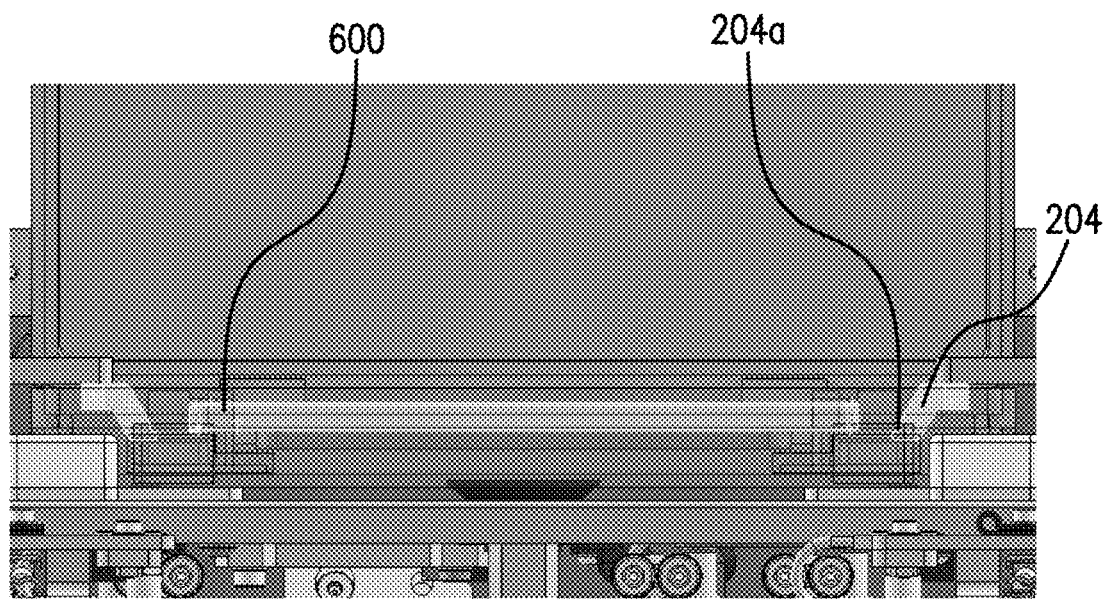
FIGS. 10A and 10B illustrate aspects of the embodiments.
Figure 10B:
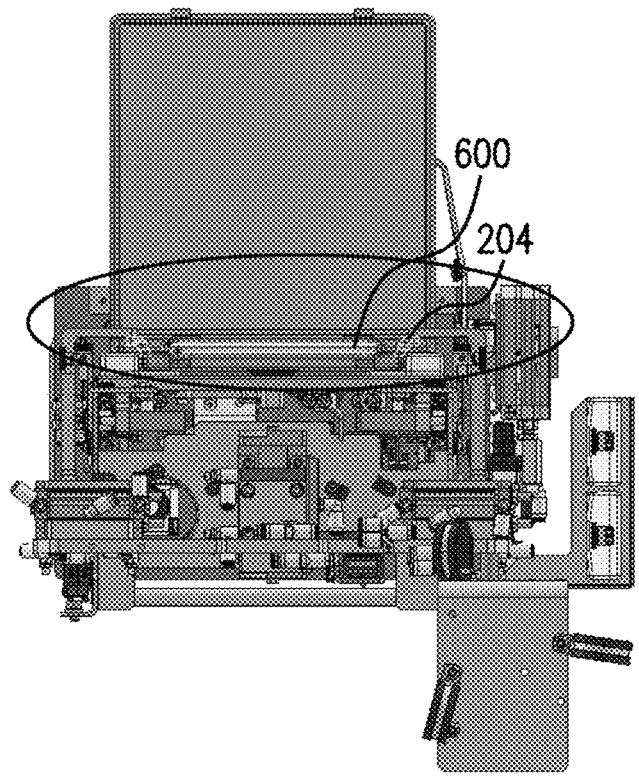

FIGS. 10A and 10B illustrate with particularity the relationship between the gripping jaws 204 and the reticle 600 upon performance of the step in FIG. 9. As shown, the grooved edge 204a of each gripping jaw 204 is sized and shaped so as to mate with the radiused edge of the reticle 600, and to minimalistically extended beneath the reticle such that the reticle can be lifted as the jaws are moved inward.

Figure 11:
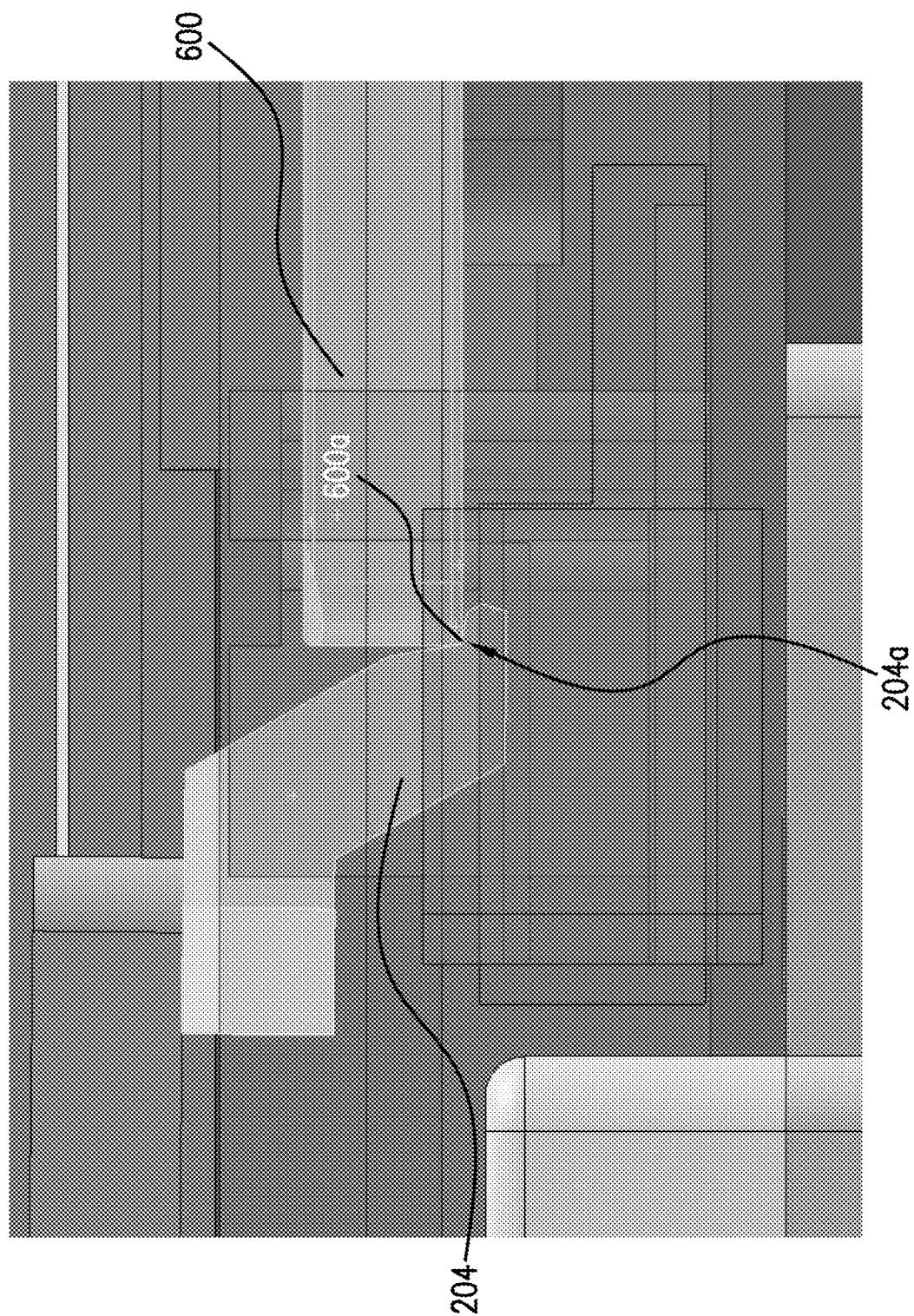
FIG. 11 illustrates aspects of the embodiments.

The embodiments of FIGS. 9 and 10A/10B are shown with greater particularity in FIG. 11. In the illustration of FIG. 11, the transverse slides have been actuated, and the gripping jaws 204 at the ends of the gripping arms 202 have been moved by the arms 202 inward toward the reticle 600. Because the grooved portion 204a of the gripping jaws 204 was already lowered to a height below the bottom radiused edge 600a of the reticle 600, actuation of the transverse slides places one portion of the gripping jaws 204a below the bottom radiused edge 600a of the reticle on each side thereof, and places another portion of the groove 204a of the gripping jaw against the side radiused edge 600a of the reticle.

Of note, the minimal contact of the gripping jaw with the reticle reduces contaminants and particulate that may damage the functionality of the reticle during downstream processing. Yet further, the angular groove 204a illustrated in the gripping jaw may be formed at an angle of greater than 90 degrees. Such an obtuse angle allows for the radiused reticle edge to rest almost solely on the corner of the groove 204a of the gripping jaw, thereby minimizing contact between the gripping jaw and the reticle.

Figure 12:
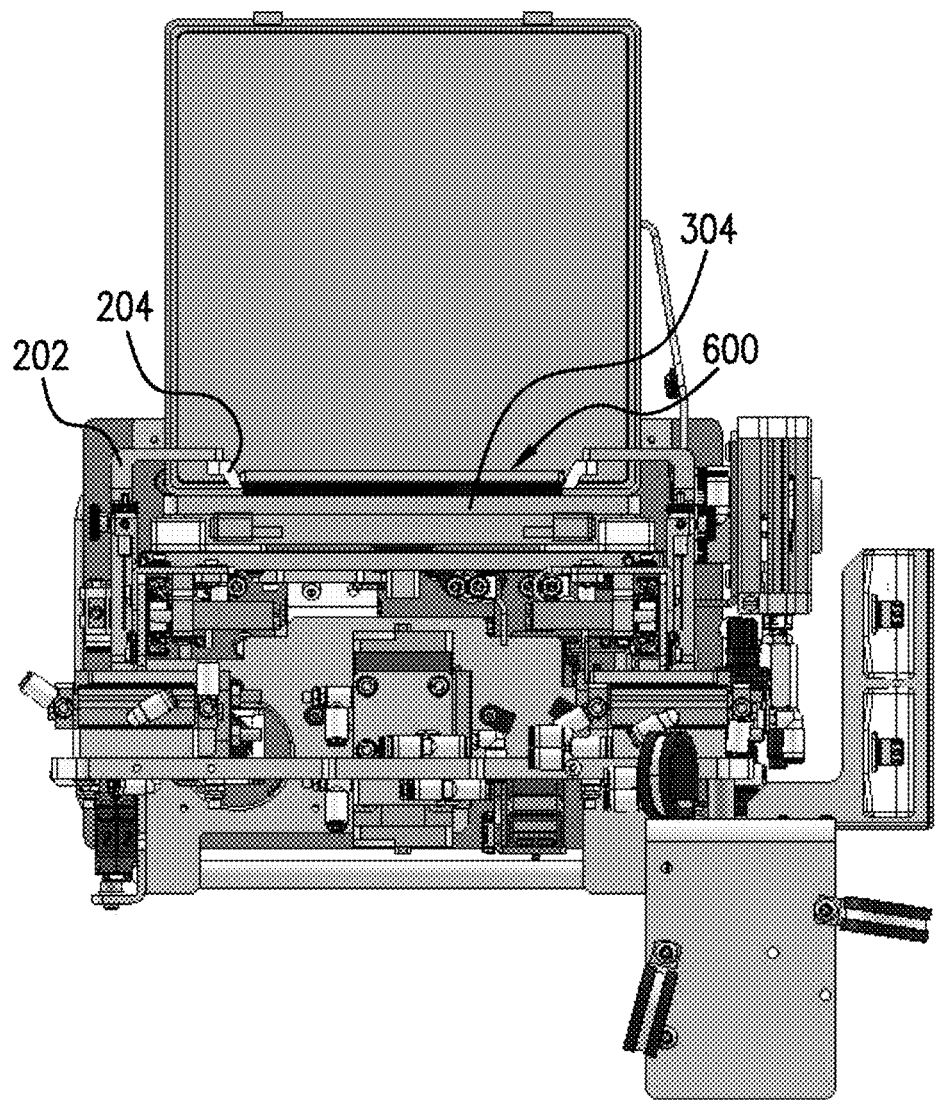
FIG. 12 illustrates aspects of the embodiments.

FIG. 12 illustrates full engagement by the jaws 204, which may include an actuation of the vertical lift plate slides, and which lifts the entirety of the reticle 600 above the compact box rim 304 as shown. This places the reticle 600 in a ready position for grasping by, for example, an end effector that will carry the reticle to its next stage for processing.

Figure 13A:
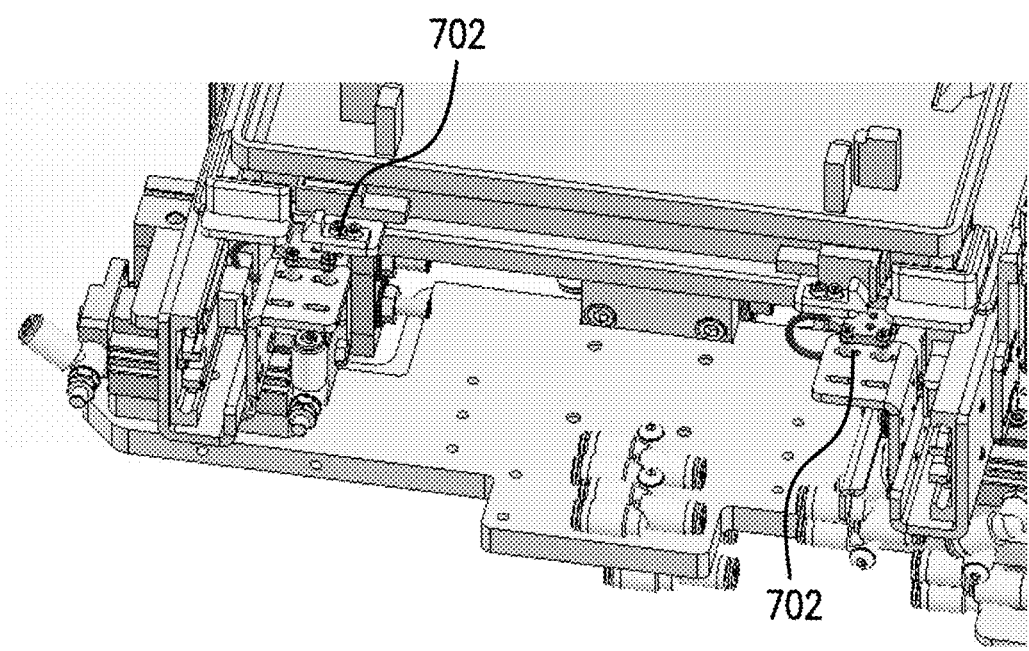
FIGS. 13A and 13B illustrate aspects of the embodiments.
Figure 13B:
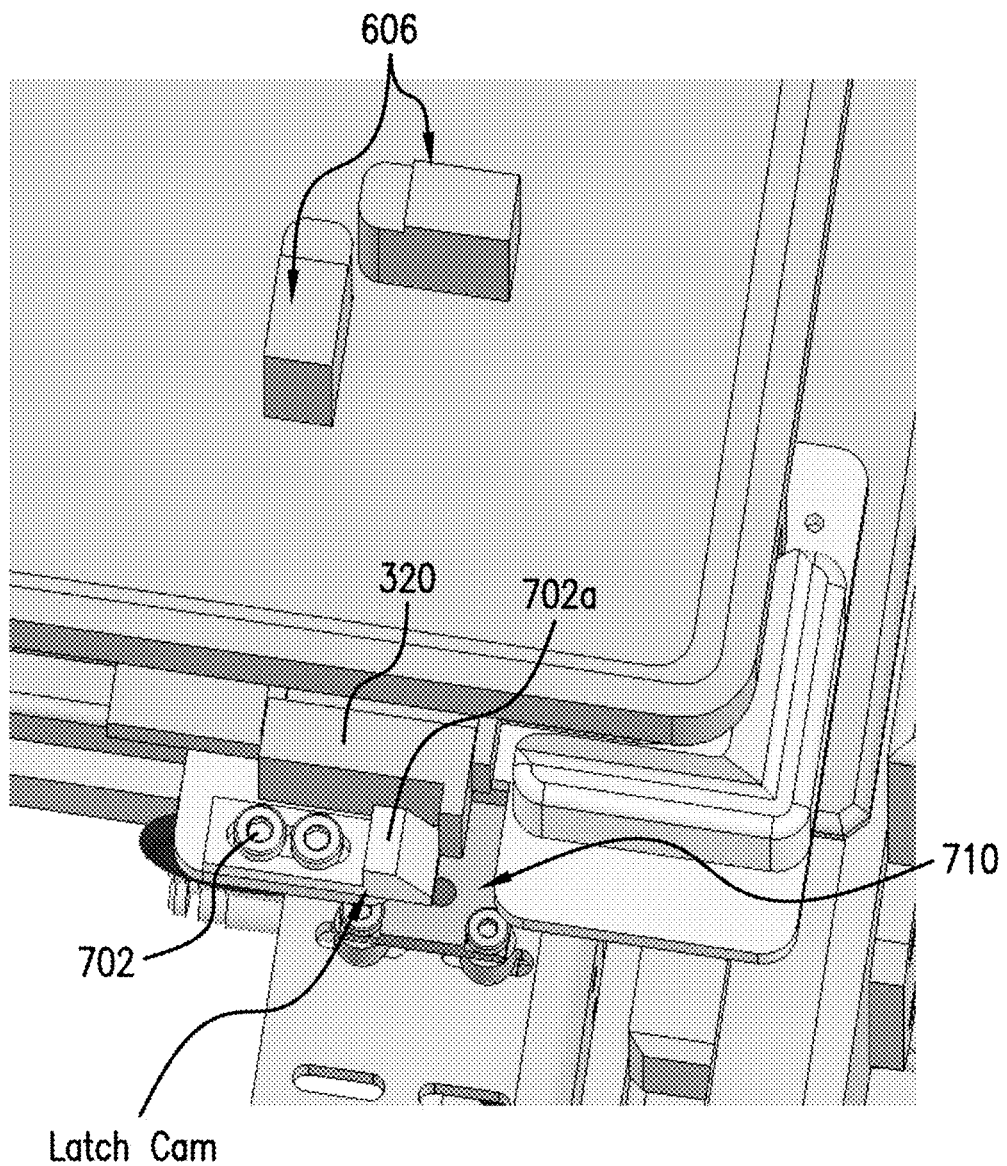

FIGS. 13A and 13B show a particular feature of the compact box opener for additional and alternative embodiments. In the illustrated embodiment, an automatic opener 702 is provided for the compact box front latches 320 discussed above. In the illustration, an automated camming system 702 is provided to open the compact box. It will be appreciated by the skilled artisan, that, although in the illustrated embodiment the cam system necessitates that the manual latches be released in the same orientation, multiple cams may be employed in embodiments in which the two front latches are to be moved in different directions.

As shown, upon seating of a compact box on the deck discussed throughout, the latch opener 702 is brought into contact with the manual latches 320 of the compact box. Once seated, the fingers 702a at the end of the cam 702 contact the protrusion at the edge of each latch 320, and move in such a way so as to open the latches.

A sensor on the opener, such as a reflective sensor 710 below each latch 320, may then verify that each latch is open. This is done so that the lid opener discussed throughout does not attempt to open the lid if the latches are still closed, as this would pull the box off the deck 106 which would be catastrophic for the disclosed processes. If the latches are verified as open, the process may proceed as discussed above. If either or both of the latches are not verified as open, processing will stop and the disclosed locking mechanisms (see FIG. 5) will lock the compact box, and hence the reticle, in place.

Moreover, the vacuum disclosed throughout may be differentially provided in order to provide enhanced security for the compact box. By way of example, the vacuum pull provided by the drawer vacuum at the deck plate may preferably be greater than the vacuum and total pulling force exerted by the lid opener on the compact box lid. Thereby, mistaken actuation of the lid opener will not pull the box in its entirety off the deck and shift the reticle unnecessarily within the compact box.

In the foregoing Detailed Description, it can be seen that various features are grouped together in a single embodiment for the purpose of clarity and brevity of the disclosure. This method of disclosure is not to be interpreted as reflecting an intention that the embodiments require more features than are expressly recited herein. Rather, the disclosure is to encompass all variations and modifications to the disclosed embodiments that would be understood to the skilled artisan in light of the disclosure.

What is claimed is:

1. A compact box opener suitable for association with a drawer in a work cell and capable of opening a compact box containing therein a reticle, comprising:
   a flowthrough deck;
   a plurality of location guides on the flowthrough deck suitable to mate with guides on a base of the compact box;
   a plurality of vacuum ports on the plurality of location guides capable of retaining the guides on the base;
   a lid opening arm having a suction cup at an end thereof, wherein the suction cup is capable of gripping a lid of the compact box and opening the lid by an actuation of the lid opening arm;
   rotary-actuated arms that are raised for initial actuation within the drawer above a rim of the compact box and which, when actuated, rotate jaws at an end of each of the rotary-actuated arms inward over the rim and downward to a height below a lower plane of the reticle; and
   at least one angular notch in each of the jaws suitable to grip a radiused edge of the reticle;
   wherein, once the radiused edge of the reticle is gripped by the inward movement of the jaws, the jaws are raised while the reticle remains gripped until the reticle is at a second height fully above the rim.

2. The compact box opener of claim 1, wherein the flowthrough deck provides vacuum flow therethrough to decrease particulate near the reticle.

3. The compact box opener of claim 1, wherein the vacuum ports are located at a base of the location guides.

4. The compact box opener of claim 1, wherein the location guides mate with the guides on the base using a matching angle.

5. The compact box opener of claim 1, wherein the vacuum ports are corresponded one per each of the location guides.

6. The compact box opener of claim 1, wherein multiple ones of the vacuum ports are corresponded to each of the location guides.

7. The compact box opener of claim 1, further comprising at least one sensor on the drawer which capable of sensing the compact box so as to inform decisions by a work cell operator.

8. The compact box opener of claim 7, wherein the work cell operator is manual.

9. The compact box opener of claim 7, wherein the at least one sensor comprises an open switch for indicating when the drawer is fully open.

10. The compact box opener of claim 7, wherein the at least one sensor comprises an open circuit sensor indicating when the compact box is not gripped by the vacuum ports.

11. The compact box opener of claim 1, further comprising status lights on the drawer for indicating a status of the compact box opener.

12. The compact box opener of claim 1, wherein there are two of the rotary-actuated arms.

13. The compact box opener of claim 1, further comprising a vertical actuator at least partly capable of the raising of the rotary-actuated arms.

14. The compact box opener of claim 1, wherein the plurality of the location guides are four in number, and are proximate to corners of the flowthrough deck.

15. The compact box opener of claim 1, further comprising a cammed latch opener capable of opening manual latches at a front of the compact box.

16. The compact box opener of claim 1, further comprising a lock cylinder capable of locking at least the drawer and the rotary actuated arms.

17. The compact box opener of claim 16, further comprising a safety interlock switch capable of actuating the lock cylinder upon a loss of power or upon a significant gyroscopic change in position of the work cell.

18. The compact box opener of claim 1, further comprising a transverse slide capable of varying a distance between the arms as they are raised.

19. The compact box opener of claim 13, the vertical actuator comprising a vertical backplate and one or more actuators.

20. The compact box opener of claim 19, wherein the actuators comprise one of cams or pistons.

* * * * *